US008752645B2

(12) United States Patent
Liebhard

(10) Patent No.: US 8,752,645 B2
(45) Date of Patent: Jun. 17, 2014

(54) ELECTRIC POWER TOOL WITH COMMUNICATION LINE TO BATTERY PACK

(75) Inventor: Gernot Liebhard, Waiblingen (DE)

(73) Assignee: Andreas Stihl AG & Co. KG, Waiblingen (DE)

(*) Notice: Subject to any disclaimer, the term of this patent is extended or adjusted under 35 U.S.C. 154(b) by 79 days.

(21) Appl. No.: 12/690,363

(22) Filed: Jan. 20, 2010

(65) Prior Publication Data

US 2011/0094762 A1    Apr. 28, 2011

(30) Foreign Application Priority Data

Oct. 23, 2009   (DE) .......................... 10 2009 050 547

(51) Int. Cl.
*E21B 4/04* (2006.01)

(52) U.S. Cl.
USPC ................................ 173/217; 173/1; 320/134

(58) Field of Classification Search
USPC ................................ 173/1, 217; 320/134, 136
See application file for complete search history.

(56) References Cited

U.S. PATENT DOCUMENTS

| 5,945,806 A | * | 8/1999 | Faulk | 320/127 |
|---|---|---|---|---|
| 7,435,232 B2 | * | 10/2008 | Liebschner | 600/587 |
| 7,439,706 B2 | * | 10/2008 | Brenner | 320/106 |
| 2004/0070369 A1 | * | 4/2004 | Sakakibara | 320/128 |
| 2005/0073282 A1 | * | 4/2005 | Carrier et al. | 320/106 |
| 2006/0087285 A1 | * | 4/2006 | Phillips et al. | 320/114 |
| 2006/0159984 A1 | * | 7/2006 | Nagayama et al. | 429/61 |
| 2007/0016337 A1 | * | 1/2007 | Iwagami et al. | 701/1 |
| 2007/0029993 A1 | * | 2/2007 | Chao et al. | 324/130 |
| 2008/0180059 A1 | * | 7/2008 | Carrier et al. | 320/112 |
| 2008/0203995 A1 | * | 8/2008 | Carrier et al. | 323/351 |
| 2008/0238370 A1 | * | 10/2008 | Carrier et al. | 320/134 |

* cited by examiner

*Primary Examiner* — Thanh Truong
*Assistant Examiner* — Nathaniel Chukwurah
(74) *Attorney, Agent, or Firm* — Gudrun E. Huckett

(57) ABSTRACT

An electric power tool has a drive motor and an electronic control unit. Power is supplied by a battery pack with several individual cells and a monitoring circuit for the operating parameters of the cells. A communication line connects electronic control unit and monitoring circuit. Digital data are exchanged through the communication line between electronic control unit and monitoring circuit. A controller controls data traffic through sending and receiving units. The communication voltage is higher than a permissible input voltage level of the controller and lower than a maximum battery pack voltage. The receiving unit, as a filter, converts a received first signal level that is lower than a first voltage to a LOW signal and lowers a received second signal level that is higher than a second voltage to the input voltage level of the controller and relays the second signal level as a HIGH signal.

12 Claims, 2 Drawing Sheets

ELECTRIC POWER TOOL WITH COMMUNICATION LINE TO BATTERY PACK

BACKGROUND OF THE INVENTION

The invention relates to an electric power tool comprising a battery pack for driving a working tool. The invention also relates to a charging station for the battery pack.

Electric power tools with a drive motor for driving a working tool that have an electronic control unit for controlling and operating the electric drive motor are known. The power tool is supplied with power from the battery pack through the control unit.

Battery packs are comprised of several individual cells wherein, depending on the employed cells, monitoring circuits are provided for detecting operating parameters such as charge state, cell voltage, cell current and/or cell temperature. The data are evaluated appropriately for which purpose a communication line between the control unit and the monitoring circuit is provided. Through this communication line digital data are exchanged between the control unit and the monitoring circuit at a communication voltage level wherein interfaces with a controller are provided for controlling the data traffic through a sending unit and a receiving unit.

Electric power tools such as motor chain saws, cut-off machines, hedge trimmers, grass/brush trimmers or the like are compact devices whose drive technology is provided within a very small space. Despite high battery pack voltage, significant currents occur in operation and induce disturbances or interference in the communication line. In order to avoid this, in addition to mechanical and electric shielding, complex electronic devices are employed in order to differentiate the transmitted data properly from interference data.

SUMMARY OF THE INVENTION

It is an object of the present invention to configure a communication line in an electric power tool in such a way that with minimal expenditure a disturbance-free and safe data traffic through the communication line is possible.

In accordance with the present invention, this is achieved in that the communication voltage that can be tapped at the communication line is higher than the permissible input voltage level of the controller and lower than the maximum battery pack voltage. The receiving unit, acting as a filter, will convert a received signal level lower than a first voltage to a LOW signal (digital 0) and will lower a second received to signal level that is higher than a second voltage to the input voltage level of the controller and relay it as a HIGH signal (digital 1).

The first voltage level, below which all signals are recognized or detected as LOW signal (digital 0) is higher than the input voltage level of the controller. Therefore, all disturbances that occur below this signal level cannot cause faulty HIGH signals and are suppressed. Only signals above a second higher voltage level are identified as HIGH signals (digital 1) wherein the threshold is selected such that the occurring disturbance or interference impulses will not or only seldomly reach the voltage level.

In a simple embodiment of the invention the communication line, through appropriate electronic components, is connected indirectly to the positive terminal of the battery pack wherein the communication voltage advantageously is adjusted to be approximately in the range of half the maximum battery pack voltage, in particular, in the range of 10 to 25 volt. For this purpose, it is provided to apply the battery pack voltage advantageously by means of a voltage divider to the communication line wherein the voltage divider is designed such that the battery pack voltage is reduced to the desired communication voltage, for example, is approximately cut in half. It can also be expedient to provide a voltage regulator that, particularly as a stabilized voltage source, is able to provide any desired communication voltage, i.e., also voltages of e.g. 10V to 25V.

In the illustrated embodiment, as a result of 10 lithium ion cells that are connected in series, the battery pack voltage advantageously has a value of approximately 42 volt but, depending on the configuration of the battery pack and the employed, cells (NiCd, NiMH, Li-ion), can have voltage ranges of less than 42 volt but also more than that, for example, 100V and even more.

Even though in a simple configuration the battery pack voltage applied by means of a voltage divider to the communication line is not stabilized, it is ensured as a result of raising the communication voltage level in a range above the input voltage level of the controller that also for a dropping battery pack voltage as a result of discharge a safe recognition of the digital data is enabled.

The data flow that is applied to the communication line is provided as an electric current wherein the signal voltage of the communication line is tapped at a current-carrying resistor.

Advantageously, the battery pack is comprised of individual cells that are based on lithium, in particular lithium-ion cells, lithium-polymer cells or the like.

In a further embodiment of the invention, a charge device for a battery pack for charging a battery pack is provided that is comprised of a plurality of cells that are connected to one another. The charge device comprises a control unit for controlling the charge process of the connected battery pack wherein the battery pack comprises a monitoring circuit for detecting the operating parameters such as charge state, cell voltage, cell current and/or cell temperature. In accordance with the configuration of an electric power tool, the charge device has also a communication line between the control unit and the monitoring circuit wherein the communication voltage of the communication line is higher than the permissible input voltage level of a controller and lower than the maximum battery pack voltage.

DESCRIPTION OF THE PREFERRED EMBODIMENTS

Figure 1:
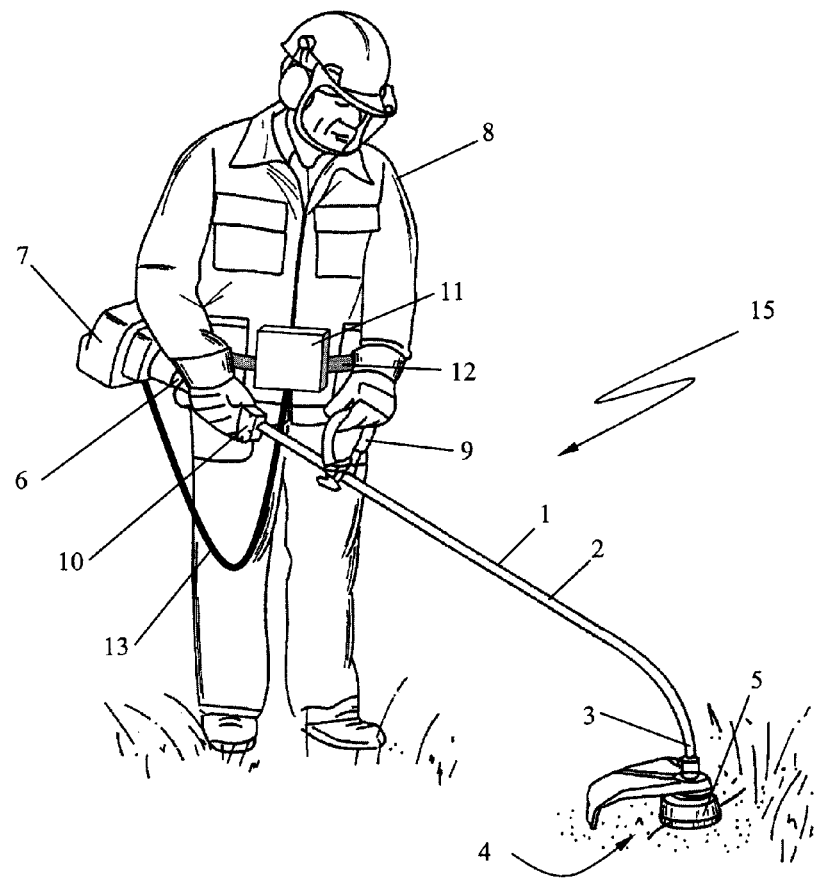
FIG. 1 is a schematic illustration of a trimmer that is supplied with power by a battery pack that is carried on the body of the operator.

The power tool 15 illustrated in FIG. 1 is a so-called trimmer 1 comprised substantially of an elongated guide tube 2 that has at the end 3 that is proximal to the ground the working tool 4 in the form of a tool head 5 that, in the illustrated embodiment, is a thread-based cutter.

At the other end 6 of the guide tube 2 an electric drive motor is received in housing 7 that drives the tool head 5 in rotation by means of a drive shaft guided in the guide tube 2.

In the embodiment according to FIG. 1 the trimmer 1 is carried and guided by the operator 8 by means of a forward bow-shaped grip 9 as well as a rear grip 10 that is arranged between the bow-shaped grip 9 and the housing 7 on the guide tube. The power required for driving the electric drive motor arranged in the housing 7 is provided by battery pack 11 that is carried by the operator by means of belt 12 or the like on the body. It can be expedient to integrate the battery pack 11 into the housing 7 of the power tool 15.

The battery pack 11 is connected by cable 13 to the control unit 21 (FIG. 3) in the housing 7 wherein the cable 13 transmits the electric drive energy and also comprises a communication line by means of which a repeated information exchange between a monitoring circuit 31 (FIG. 3) in the casing of the battery pack 11 and the control unit 21 in the housing 7 of the power tool 15 is possible.

Figure 2:
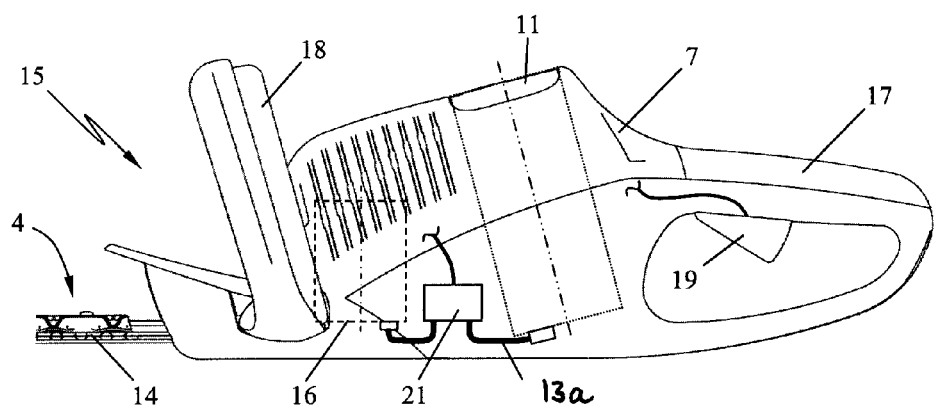
FIG. 2 is a schematic illustration of a side view of a hedge trimmer with inserted battery pack.

As shown in FIG. 2, alternative to the configuration of an electric power tool according to FIG. 1, the battery pack 11 can be integrated into the housing 7 of the power tool 15. The hedge trimmer illustrated in FIG. 2 has a drive motor 16 that is controlled by a control unit 21. The control unit 21, in analogy to cable 13 in FIG. 1, is connected by cable 13a to the battery pack 11 wherein the cable 13a enables energy transmission to the control unit 21 as well as data traffic between a monitoring circuit 31 of the battery pack 11 and the control unit 21. This is illustrated in detail in FIG. 3.

The hedge trimmer illustrated in FIG. 2 has as a working tool 4 a cutter bar 14 with reciprocating shearing blades wherein the power tool 15 itself has a rear handle 17 that is oriented in longitudinal direction of the cutter bar 14 as well as a forward bow-shaped handle 18 that is secured on the housing at the front end of the housing 7 at the transition into the cutter bar 14. By means of switch 19 at the rear handle 17 the control unit 21 is controlled for operating the power tool 15.

Figure 3:
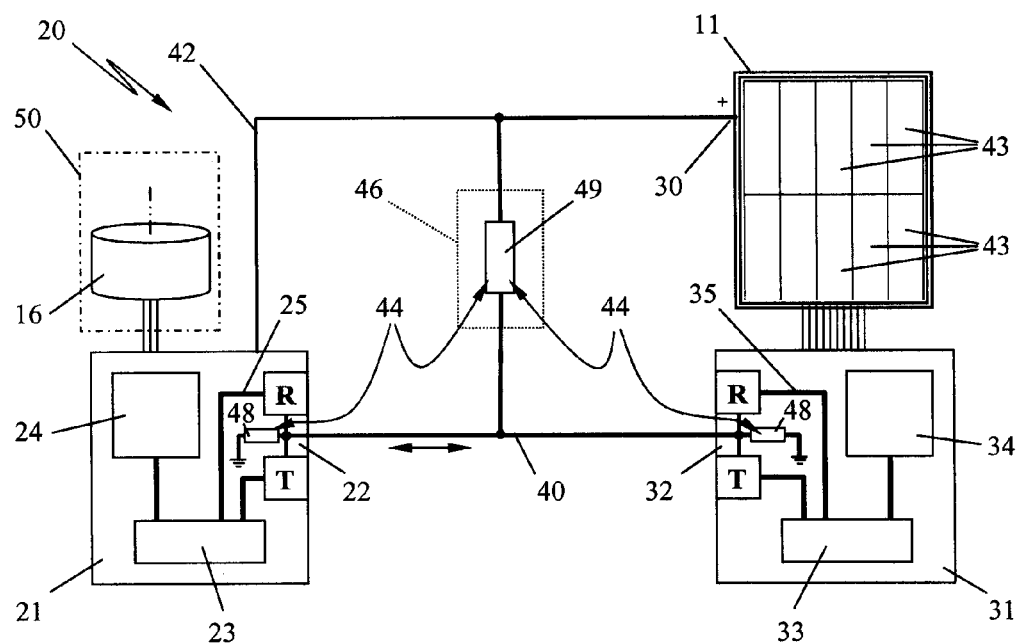
FIG. 3 is a schematic illustration of a communication connection between the monitoring circuit of a battery pack and the control device of a motor or a charge device.

FIG. 3 shows a schematic block diagram for illustrating the data communication between the control unit 21 and the monitoring circuit 31 that are connected to one another by communication line 40.

The control unit 21 serves, for example, for controlling an electric motor 16 that is provided as a drive motor in an electric power tool 15 such as a grass/brush trimmer, a hedge trimmer, a motor chain saw or the like.

The drive motor 16 is a direct current motor (DC motor) but preferably can be a brushless drive motor (EC motor) that is electrically commutated for which purpose the control unit 21 comprises the required control device. In the illustrated embodiment, the current required for operating the brushless motor is supplied by means of control unit 21 and connecting line 42.

When the control unit 21 is part of a charge device 50 that is illustrated in dashed lines in FIG. 3, the battery pack 11 is charged by means of the control unit 21 and the connecting line 42.

The monitoring circuit 31 serves for detecting the operating parameters such as charge state of the battery pack 11 as well as the operating conditions of the individual cells 43 of the battery pack 11 such as charge state, cell voltage, cell current and/or cell temperature.

In order to transmit the operating parameters of the battery pack 11 to the control unit 21 so that the control unit 21 will adjust the load on the battery pack as a function of the operating parameters of the battery pack 11, the communication line 40 is provided. By means of interfaces 22, 32 the communication line 40 is connected to receiving unit R as well as sending unit T so that a bidirectional data exchange is possible. The received data are relayed to a controller 23, 33 that makes available the data package to a microprocessor 24, 34 for further processing. In the same way, the controllers 23 and 33 are connected to the sending unit T in order to send the data relayed by the microprocessor 24, 34 to the controller 23, 33 through the communication line 40.

The communication line 40 is connected by means of active or passive electronic components, not illustrated, indirectly to the positive pole 30 of the battery pack 11 wherein the battery pack voltage itself is applied by a voltage divider 44 to the communication line 40. In this way, the communication voltage of the communication line 40, i.e., the voltage amplitude of the transmitted data, is significantly increased wherein the communication voltage is significantly higher than the permissible input voltage level $U_C$ of the controllers 23, 33 that have typically a magnitude of 5 volt or 3.3 volt. As a result of applying the battery pack voltage to the communication line 40, as shown in FIG. 4, significantly higher signal levels can be achieved so that disturbances or interference that is injected into the communication line 40 is considerably below the selected higher communication voltage level.

By means of the sending units T the digital data that are to be transmitted are injected onto the increased communication voltage while the receiving units R are designed such that they convert a signal level $S_1$ that is lower than a first voltage $U_L$ to a LOW signal (digital 0) and lower a second received signal level $S_2$ that is higher than a second voltage $U_H$ to the input voltage level $U_C$ of the controller and relay it as a HIGH signal (digital 1).

The receiving unit R is electrically connected such that on its digital output 25 or 35 a low voltage level near 0 volt (digital 0) is applied when on the communication line 40 voltage levels below a voltage value $U_L$ of e.g. 7.5V exist. Possible interference signals occurring in the communication line 40 will be drowned in the "pool" of the low voltage level; the disturbance levels have no impact on the data traffic.

Figure 4:
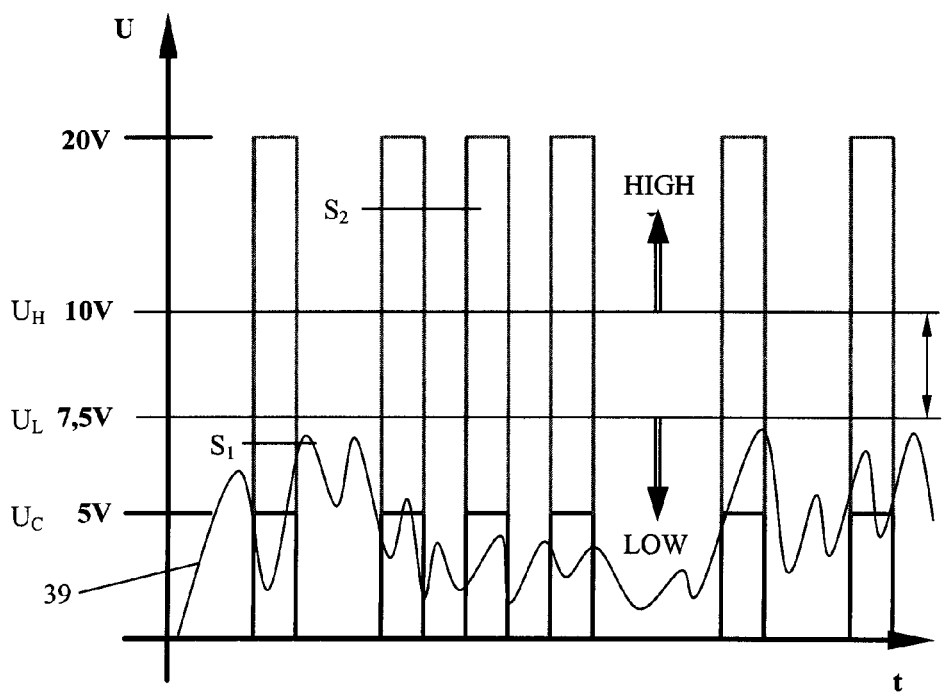
FIG. 4 is a schematic illustration of a possible signal sequence of a communication line.

In FIG. 4 this is illustrated schematically. For a typical communication voltage level of e.g. 5 volt, a voltage of e.g. 3.5 volt would be transmitted as digital 1 and a voltage of e.g. less than 1 volt as digital 0. The theoretical disturbance voltage 39 illustrated in FIG. 4 would therefore always cause errors in the data traffic when the disturbance voltage 39 overlaps a LOW signal (digital 0) and, as a result of the higher disturbance voltage level, would be falsified to a HIGH signal (digital 1). According to the present invention, an interference signal 39 is however without consequences for the data transmission because it is below the LOW voltage level $U_L$ that is significantly higher than the normal communication voltage level $U_C$. By raising the communication voltage to a multiple of the input voltage level $U_C$ of the controller 23, 33 a safe data transmission through the communication line 40 can be provided even though interference signals are induced in the communication line 40 as a result of the high operating currents that are being carried.

When a HIGH signal is present at the communication line 40, its voltage is multiple times higher than the input voltage $U_C$ of the controllers 23, 33. Such a HIGH signal has advantageously a voltage amplitude that is 3 to 8 times higher than the input voltage $U_C$. When a HIGH signal occurs at the level of increased communication voltage, this signal is converted by the receiving unit R into a HIGH signal that is reduced to the input voltage level $U_C$ of the connected controller 23, 33 and thus to a typical signal level of 3.3 volt or 5 volt.

The selection of the communication voltage is such that the communication voltage is preferably within a range of 10 to 25 volt, expediently in the range of approximately half the maximum battery pack voltage, in the illustrated embodiment e.g. 42 volt. For this purpose, the voltage divider 44 is provided which in the illustrated embodiment is configured with resistors 48 and 49 such that the battery pack voltage applied indirectly to the communication line 40 is approximately cut in half.

Since the battery pack voltage applied by the voltage divider 44 onto the communication line 40 is not stabilized, it will change in accordance with the charge state of the battery pack 11 during operation of the power tool. However, this has no effect on the disturbance-free or interference-free safe data traffic through the communication line 40 because the minimum discharge voltage of the battery pack 11 is sufficient in order to operate the data traffic through the communication line 40. The voltage value $U_L$ below which the signals are detected as LOW signals (digital 0) does not change as a result of discharge of the battery pack 11. The voltage value $U_H$ above which the signals are detected as HIGH signals (digital 1) is selected such that it is lower than the minimal discharge voltage of the battery pack 11.

In the illustrated embodiments the cells 43 of the battery pack 1 are cells based on lithium, in particular lithium-ion cells, lithium-polymer cells or the like that have a final discharge voltage of approximately 2.5 volt so that the battery pack voltage in the discharged state is approximately 25 volt. Since only half the battery pack voltage is applied to the communication line 40, HIGH levels of approximately 12 volt to 13 volt are still possible that are significantly above the threshold voltage $U_H$ above which a HIGH signal (digital 1) is detected.

As indicated in dashed lines in FIG. 3, a stabilized voltage source 46 can also be provided that, independent of the battery pack voltage, provides a preselected communication voltage. This communication voltage is advantageously below the final discharge voltage of the battery pack 11.

In a special embodiment, of the invention the data flow is applied as an electric current to the communication line 40 wherein the signal voltage of the communication line can be tapped at the current-carrying resistors 48.

The potential point between the resistor 48 and the resistor 49 that together form the voltage divider 44 are switched in the case of a LOW signal to the potential "zero", for example, by a switching element such a transistor that is parallel to the resistor 48.

The specification incorporates by reference the entire disclosure of German priority document 10 2009 050 547.4 having a filing date of Oct. 23, 2009.

While specific embodiments of the invention have been shown and described in detail to illustrate the inventive principles, it will be understood that the invention may be embodied otherwise without departing from such principles.

What is claimed is:

1. A charge device for charging a battery pack that is comprised of a plurality of connected cells, the charge device comprising:
   a control unit for controlling a charging process of a connected battery pack, wherein said control unit is arranged in a housing of a power tool and wherein said battery pack is an energy supply that supplies energy for a drive motor of the power tool and said control unit through a connecting line;
   wherein said battery pack has a monitoring circuit for detecting operating parameters of said cells selected from charged state, cell voltage, cell current, cell temperature, and others;
   a communication line between said control unit and said monitoring circuit, wherein at a communication voltage level digital data are exchanged between said control unit and said monitoring circuit;
   a controller for controlling data traffic through a sending unit and a receiving unit;
   wherein a communication voltage tapped at said communication line is higher than a permissible input voltage level of said controller and lower than a maximum battery pack voltage;
   wherein said receiving unit, as a filter, converts a received first signal level that is lower than a first voltage to a LOW signal and lowers a received second signal level that is higher than a second voltage to said input voltage level of said controller and relays said second signal level as a HIGH signal;
   wherein said communication voltage is in a range of 10 volt to 25 volt.

2. An electric power tool comprising:
   a drive motor for driving a working tool of the electric power tool;
   an electronic control unit for controlling and operating said electric drive motor;
   a battery pack as an energy supply for said drive motor and said electronic control unit;
   wherein said battery pack is comprised of several individual cells and a monitoring circuit connected to the individual cells for detecting operating parameters selected from the group consisting of charge state, cell voltage, cell current, cell temperature, and others;
   a communication line connecting said electronic control unit and said monitoring circuit, wherein digital data are exchanged through said communication line between said electronic control unit and said monitoring circuit at a communication voltage level;
   a controller for controlling data traffic through a sending unit and a receiving unit;
   wherein a communication voltage that is tapped at said communication line is higher than a permissible input voltage level of said controller and lower than a maximum battery pack voltage;
   wherein said receiving unit, as a filter, converts a received first signal level that is lower than a first voltage to a LOW signal and lowers a received second signal level that is higher than a second voltage to said input voltage level of said controller and relays said second signal level as a HIGH signal;
   wherein said communication voltage is in a range of 10 volt to 25 volt.

3. The power tool according to claim 2, wherein said communication line is indirectly connected to a positive pole of said battery pack.

4. The power tool according to claim 2, wherein said communication voltage is approximately within a range of half a maximum battery pack voltage.

5. The power tool according to claim 2, further comprising a voltage divider, wherein said battery pack voltage is applied by said voltage divider to said communication line.

6. The power tool according to claim 5, wherein said voltage divider cuts in half said battery pack voltage.

7. The power tool according to claim 2, wherein said battery pack voltage applied to said communication line is not voltage-stabilized.

8. The power tool according to claim 2, further comprising a stabilized voltage source that is supplied by said battery pack voltage and provides said communication voltage.

9. The power tool according to claim 2, wherein said battery pack has a maximum battery pack voltage of approximately 42 volt.

10. The power tool according to claim 2, further comprising a current-carrying resistor, wherein said data flow is an electric current and a signal voltage on said communication line is tapped at said current-carrying resistor.

11. The power tool according to claim 2, wherein said cells of said battery pack are lithium-based cells.

12. The power tool according to claim 2, wherein said lithium-based cells are lithium-ion cells or lithium-polymer cells.

* * * * *